United States Patent
Bennett

(10) Patent No.: US 6,707,558 B2
(45) Date of Patent: Mar. 16, 2004

(54) DECREASING THE EFFECTS OF LINEAR BIREFRINGENCE IN A FIBER-OPTIC SENSOR BY USE OF BERRY'S TOPOLOGICAL PHASE

(75) Inventor: Sidney M. Bennett, Chicago, IL (US)

(73) Assignee: KVH Industries, Inc., Middletown, RI (US)

( * ) Notice: Subject to any disclaimer, the term of this patent is extended or adjusted under 35 U.S.C. 154(b) by 152 days.

(21) Appl. No.: 09/921,383

(22) Filed: Aug. 2, 2001

(65) Prior Publication Data

US 2002/0018212 A1 Feb. 14, 2002

Related U.S. Application Data

(60) Provisional application No. 60/222,395, filed on Aug. 2, 2000.

(51) Int. Cl.$^7$ .................................................. G01B 9/02
(52) U.S. Cl. ........................................ 356/483; 356/465
(58) Field of Search ................................. 356/465, 483; 250/227.19, 227.27; 385/12; 324/244.1, 76.37, 95, 96, 97

(56) References Cited

U.S. PATENT DOCUMENTS

| | | |
|---|---|---|
| 4,571,650 A | 2/1986 | Ojima et al. |
| 4,603,931 A | 8/1986 | Ruffman |
| 4,615,582 A | 10/1986 | Lefevre et al. |
| 4,630,229 A | 12/1986 | D'Hondt |
| 4,630,890 A | 12/1986 | Ashkin et al. |
| 4,637,722 A | 1/1987 | Kim |
| 4,668,264 A | 5/1987 | Dyott |
| 4,669,814 A | 6/1987 | Dyott |
| 4,697,876 A | 10/1987 | Dyott |
| 4,705,399 A | 11/1987 | Graindorge et al. |

(List continued on next page.)

FOREIGN PATENT DOCUMENTS

| | | |
|---|---|---|
| DE | 33 05 104 A1 | 8/1984 |
| DE | 36 15 305 A1 | 11/1987 |
| DE | 37 42 201 A1 | 6/1989 |
| EP | 0 551 874 A2 | 7/1993 |
| EP | 0 586 242 A1 | 3/1994 |
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| FR | 2 535 463 A | 5/1984 |
| JP | 07209398 | 8/1995 |
| WO | WO98/58268 A | 12/1998 |
| WO | WO 00 31551 A | 6/2000 |
| WO | WO00/36425 | 6/2000 |

OTHER PUBLICATIONS

US 6,208,775, 3/2001, Dyott (withdrawn)
Ankiewicz et al. "Berry's phase analysis of polarization rotation in helicoidal fibers" Jun. 20, 1998 Applied Optics vol. 37, No 18 pp 3902–3911.*
Alekseev et al; "Fiber Optic Gyroscope With Suppression of Excess Noise From the Radiation Source", Technical Physical Letters, 24(9): 719–721, (Sep. 1998).
Blake et al., "In–Line Sagnac Interferometer Current Sensor." IEEE, pp. 116–121 (1995).

(List continued on next page.)

Primary Examiner—Samuel A. Turner
Assistant Examiner—Patrick Connolly
(74) Attorney, Agent, or Firm—Foley Hoag, LLP

(57) ABSTRACT

The invention relates to the field of fiber optics, and more particularly to birefringence in single-mode fibers. The sensitivity of a fiber optic sensor coil for a current sensor may be increased by winding the sensing fiber, without torsion, around a current-carrying wire to form the coil, wherein the pitch angle of the fiber may be selected to result in a phase shift due to Berry's phase of circularly polarized light propagating through the fiber. Preferably, the pitch angle may be approximately 60°.

21 Claims, 5 Drawing Sheets

U.S. PATENT DOCUMENTS

| | | |
|---|---|---|
| 4,712,866 A | 12/1987 | Dyott |
| 4,733,938 A | 3/1988 | Lefevre et al. |
| 4,740,085 A | 4/1988 | Lim |
| 4,755,021 A | 7/1988 | Dyott |
| 4,765,739 A | 8/1988 | Koizumi et al. |
| 4,776,700 A | 10/1988 | Frigo |
| 4,796,993 A | 1/1989 | Sonobe et al. |
| 4,815,817 A | 3/1989 | Levinson |
| 4,842,409 A | 6/1989 | Arditty et al. |
| 4,848,910 A | 7/1989 | Dupraz |
| 4,883,358 A | 11/1989 | Okada |
| 4,887,900 A | 12/1989 | Hall |
| 4,943,132 A | 7/1990 | Huang |
| 5,033,854 A | 7/1991 | Matthews et al. |
| 5,048,962 A | 9/1991 | Kurokawa et al. |
| 5,056,919 A | 10/1991 | Arditty et al. |
| 5,074,665 A | 12/1991 | Huang et al. |
| 5,080,489 A | 1/1992 | Nishikawa et al. |
| 5,106,193 A | 4/1992 | Fesler et al. |
| 5,133,600 A | 7/1992 | Schroder |
| 5,135,555 A | 8/1992 | Coyle, Jr. et al. |
| 5,136,235 A | 8/1992 | Brandle et al. |
| 5,148,236 A | 9/1992 | Blake et al. |
| 5,289,257 A | 2/1994 | Kurokawa et al. |
| 5,289,258 A | 2/1994 | Szafraniec et al. |
| 5,331,404 A | 7/1994 | Moeller et al. |
| 5,351,123 A | 9/1994 | Spahlinger |
| 5,359,413 A | 10/1994 | Chang et al. |
| 5,365,338 A | 11/1994 | Bramson |
| 5,412,471 A | 5/1995 | Tada et al. |
| 5,457,532 A | 10/1995 | August et al. |
| 5,459,575 A | 10/1995 | Malvern |
| 5,469,257 A | 11/1995 | Blake et al. |
| 5,469,267 A | 11/1995 | Wang |
| 5,471,301 A | 11/1995 | Kumagai et al. |
| 5,475,772 A | 12/1995 | Hung et al. |
| 5,493,396 A | 2/1996 | Sewell |
| 5,500,909 A | 3/1996 | Meier |
| 5,504,684 A | 4/1996 | Lau et al. |
| 5,513,003 A | 4/1996 | Morgan |
| 5,552,887 A | 9/1996 | Dyott |
| 5,559,908 A | 9/1996 | August et al. |
| 5,644,397 A | 7/1997 | Blake |
| 5,654,906 A | 8/1997 | Youngquist |
| 5,655,035 A | 8/1997 | Burmenko |
| 5,682,241 A | 10/1997 | Mark et al. |
| 5,696,858 A | 12/1997 | Blake |
| 5,701,177 A | 12/1997 | Kumagai et al. |
| 5,701,376 A | 12/1997 | Shirasaki |
| 5,767,509 A | 6/1998 | Cordova et al. |
| 5,781,675 A | 7/1998 | Tseng et al. |
| 5,854,864 A | 12/1998 | Knoesen et al. |
| 5,898,496 A | 4/1999 | Huang et al. |
| 5,946,097 A | 8/1999 | Sanders et al. |
| 5,987,195 A | 11/1999 | Blake |
| 6,023,331 A * | 2/2000 | Blake et al. ............... 356/477 |
| 6,025,915 A | 2/2000 | Michal et al. |
| 6,047,095 A | 4/2000 | Knoesen et al. |
| 6,075,915 A | 6/2000 | Koops et al. |
| 6,148,131 A | 11/2000 | Geertman |
| 6,163,632 A | 12/2000 | Rickman et al. |
| 6,185,033 B1 | 2/2001 | Bosc et al. |
| 6,188,811 B1 | 2/2001 | Blake |
| 6,233,371 B1 | 5/2001 | Kim et al. |
| 6,301,400 B1 | 10/2001 | Sanders |
| 6,307,632 B1 | 10/2001 | Blake |
| 6,351,310 B1 | 2/2002 | Emge et al. |
| 6,356,351 B1 | 3/2002 | Blake |
| 6,370,289 B1 | 4/2002 | Bennett |
| 6,434,285 B1 | 8/2002 | Blake et al. |
| 6,535,654 B1 | 3/2003 | Goettsche et al. |

OTHER PUBLICATIONS

Blake and Szafraniec, "Random Noise in PM and Depolarized Fiber Gyros", OSA Symposium Proceedings, 1997, OWB2. pp. 122–125.

Bohnert. et al., "Field Test of Interferometric Optical Fiber High–Voltage and Current Sensors" *SPIE.* vol. 2360 pp. 16–19 (Feb. 1994).

Bohnert, et al., "Temperature and Vibration Insensitive Fiber–Optic Current Sensor" *ABB,* vol. 2360 pp 336–339 (Feb. 1994).

Burns et al., "Excess Noise in Fiber Gyroscope Sources", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics,* vol. 44, No. 1, Feb. 1997, pp. 136–138.

Dagenais et al., "Low–Frequency Intensity Noise Reduction for Fiber–Optic Sensor Applications," *Optical Fiber Sensors Conference,* Jan. 29–31, 1992, pp. 177–180.

Dupraz, J.P., "Fiber–Optic Interferometers for Current Measurement: Principles and Technology", Alsthom Review No. 9: 29–44 (Dec. 1987).

Frosio, G. and Dändliker, "Reciprocal Reflection Interferometer for a Fiber–Optic Faraday Current Sensor", Applied Optics 33 (25): 6111–6122 (Sep. 1, 1994).

Gronau Yuval et al.: "Digital Signal Processing For An Open–Loop Fiber–Optic Gyroscope", Applied Optics, Optical Society of America, Washington, U.S., vol. 34, No. 25, Sep. 1, 1995, pp. 5849–5853.

Killian M. Kevin: "Pointing Grade Fiber Optic Gyroscope", IEEE AES Systems Magazine, pp. 6–10 (Jul. 1994).

LaViolette and Bossler: "Phase Modulation Control for An Interferometric Fiber Optic Gyroscope", IEEE Plan 90. Position Location and Navigation Symposium . Las Vegas, (Mar. 20–23, 1990).

Lefevre, "The Fiber–Optic Gyroscope", Artech House, Boston, pp. 29–30 (1993).

McCallion and Shimazu; "Side–Polished Fiber Provides Functionality and Transparency", Laser Focus World, 34 (9): S19–S24, (Sep. 1, 1998).

Moeller and Burns, "1.06 $\mu$m All–fiber Gyroscope with Noise Subtraction, Proceedings of the Conference on Optical Fiber Sensors", IEEE–OSA, Monterey, CA. 1992, pp. 82–85.

Moeller and Burns, "Observation of Thermal Noise in a Dynamically Biased Fiber–Optic Gyro", Optical Letters, 1996, vol. 21, pp. 171–173.

Nikos Drakos, "Circular Polarization States for Light, and Quarter–Wave Plates," *Computer Based Learning Unit, University of Leeds* (Mar. 2, 1998).

Ono et al.: "A Small–Sized, Compact, Open–loop Fibre–Optic Gyroscope with Stabilized Scale Factor", Meas. Sci. Technol. 1: 1078–1083, (1990.

Polynkin et al: "All–Optical Noise–Subtraction Scheme for a Fiber–Optic Gyroscope", Optics Letters, 25(3): 147–149, (Feb. 1, 2000).

Rabelo et al.: "SNR Enhancement of Intensity Noise–Limited FOGs", Journal of Lightwave Technology 18(12):2146–2150 (Dec. 2000).

Short S. et al., "Elimination of Birefringence Induced Scale Factor Errors in the In–Line Sagnac Interferometer Current Sensor", Journal of Lightwave Technology 16 (10): 1844–1850 (Oct. 1998).

\* cited by examiner

DECREASING THE EFFECTS OF LINEAR BIREFRINGENCE IN A FIBER-OPTIC SENSOR BY USE OF BERRY'S TOPOLOGICAL PHASE

RELATED APPLICATIONS

This application claims priority to, and incorporates by reference, the entire disclosure of U.S. Provisional Patent Application No. 60/222,395, filed on Aug. 2, 2000.

FIELD OF THE INVENTION

The invention relates to the field of fiber optics, and more particularly to birefringence in single-mode fibers.

BACKGROUND OF THE INVENTION

Linear birefringence in single-mode optical fibers arises from either geometrical effects or anisotropic stresses in the core. In extreme cases, the core may be intentionally distorted into an ellipse or subjected to strong internal anisotropic stress and result in polarization maintaining fiber. All fiber has some core ellipticity, though in modern single-mode communications fiber it is limited to less than 1%. There is a great desire to limit core ellipticity to minimize the linear birefringence that causes polarization mode dispersion (PMD). This effect limits the maximum information bandwidth that can be transmitted on an optical link of a given length due to pulse broadening. Another cause of linear birefringence is stress caused by bending of the fiber, although this can be minimized by avoiding small radius bends.

When a single mode optical fiber is used for current sensing by forming a loop around an electrical conductor, linear birefringence can be shown to cause a reduction in the sensitivity from that which is anticipated due to the Verdet constant of the fiber. The sensitivity, S, can be shown to have the following approximate form:

$$S = \rho \sin \delta / \delta,$$

wherein $\rho = VNI$:
  V=Verdet Constant in rad/Amp;
  N=number of turns in the fiber coil;
  I=current in conductor enclosed by coil; and $$\delta = \beta ND\pi,$$

$\beta$=linear birefringence in rad/m, and
  D=diameter of the fiber coil in meters.

Since $ND\pi$ is the length of the fiber in the coil (neglecting pitch of the coil turns), the sensitivity decreases along the length of the coil. Since the linear birefringence due to the various stresses is a function of temperature in a relatively unpredictable way, the sensitivity (scale factor) of the coil is difficult to control, thereby also making calibration difficult.

It has been shown that the introduction of circular birefringence in a single-mode fiber Faraday-effect magnetic sensing coil can mitigate the effects of incidental linear birefringence which are due to such phenomena as bending stress, residual ellipticity, and compression due to the coating of the fiber. If the amount of circular birefringence is substantially greater than the linear birefringence per unit length, then the sensitivity of the coil per turn becomes essentially independent of the number of turns, and also substantially independent of temperature. This permits the construction of accurate sensing coils whose sensitivity is substantially independent of temperature. This method differs from the method of annealing the fiber coil to relieve the mechanical stresses. (Though the Verdet constant may also vary with temperature and affect sensitivity, this effect may be dealt with separately.)

Circular birefringence can be introduced in different ways. A fiber can be twisted (thereby putting it in torsion) or the preform can be spun when the fiber is made so that the twist is "frozen" in the fiber. Both of these effects can be shown to reduce the effect of linear birefringence on PMD and on the current sensitivity.

It has been shown that torsional-stress-induced circular birefringence introduced by twisting the fiber can be used to "swamp" the linear birefringence. The fiber can then be annealed to eliminate or at least reduce any additional stress-induced linear birefringence. In another example disclosed in U.S. Pat. No. 6,023,331 to Blake, which is incorporated herein by reference, a helical coil of fiber was wrapped around a torus. The fiber is subjected to a number of twists to establish circular birefringence which tends to cancel out the effects of linear birefringence. A twist in this context may be an essentially constant rotation per unit length of the fiber, along the length of the sensing coil. Blake suggested that specific values of the circular birefringence exist for closed-loop fiber-optic sensors, where the linear birefringence can be cancelled exactly, producing a zero scale factor error. These specific values of the circular birefringence depend on the pitch angle $\Theta$) and the radius of the helix R. For a coil with N turns, the zero scale factor error solutions may be achieved by:

$$T = N^* \sin \Theta^* \cos \Theta / R,$$

where T is the rotation caused by circular birefringence.

Using the above relations allows the fabrication of Faraday-effect sensing coils that do not require annealing. However, achieving this effect requires a specific number of turns or twists (determined by the equation for T) in the helix which is wound around the torus mandrel. Blake also notes that introducing a large number of twists in the optical fiber is impractical as such a tightly-wound fiber will creep over time. It would therefore be desirable to develop a less complex fiber-optic sensor coil, i.e., one which depends only on pitch angle and not requiring a specific number of turns or twists, yet having a significant effect comparable to circular birefringence that can overcome or "swamp" any residual linear birefringence of the coil.

SUMMARY OF THE INVENTION

According to one aspect of the invention, a fiber optic sensor coil for a current sensor for increased sensitivity may have at least one winding. The sensing fiber may be wound without torsion, i.e., without torsion twists, around a current-carrying wire to form the coil. A helix can be wound with or without torsion, depending on whether the free end of the fiber in the winding process is constrained from rotation, or permitted to freely rotate, respectively. The pitch of a torsionless fiber may be selected to result in a specific phase shift of circularly polarized light propagating through the fiber, wherein the phase shift can be caused by Berry's phase.

According to another aspect of the invention, a fiber optic interferometric current sensor may include a sensing fiber encircling a current-carrying conductor and wound with a pitch. Two circularly polarized light waves may propagate along the sensing fiber. The pitch of the sensing fiber may be selected so as to provide a Berry's phase shift of the circularly polarized light waves that may be substantially greater than a phase shift caused by a linear birefringence in the sensing fiber.

Embodiments of the invention may include one or more of the following features. The pitch may be between 20° and 70°, preferably approximately 60°. A pitch outside this range may be used, though may not provide an optimum effect. The form on which the fiber is wound may be slotted such that the fiber helix may be threaded onto the conductor without breaking the conductor. The sensing fiber may be wound in the form of a bobbin, the fiber having a first section with a first winding direction and a second section with a second winding direction. The pitch of the fiber will necessarily decrease to zero so as to reverse the winding direction. The sense of phase rotation, however, may not be changed. The length of fiber in the reversal region may be minimized, as it does not produce a Berry's phase shift. The fiber may also be wound in the form of a helix around a torus, which encircles the conductor.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

By way of background information, a helically wound fiber introduces Berry's topological phase, independent of the state of polarization and the wavelength of the light propagating in the fiber. When plane polarized light propagates along a three-dimensional path in space, the plane of polarization rotates. The rotation is independent of deformations in the fiber path if the solid angle of the path in momentum space stays constant. This effect does not rely on torsion in the fiber. The phase change introduced by Berry's phase is different in its origin, but produces a similar effect as the previously discussed "circular birefringence." For light propagating in a single-mode optical fiber, the propagation vector coincides with the fiber axis, and the effect can be produced by winding the fiber in a suitable shape, such as a helix. This has been demonstrated in controlling the amplitude of the light returned from a loop mirror as well as direct measurements of the effect. As noted, the effect of Berry's phase on the sensitivity of the fiber to the Faraday effect is similar to that of conventional circular birefringence caused by spinning and/or twisting and annealing the fiber, or by winding the fiber in a manner that achieves torsional stress. Since the sensitivity of the fiber to the magnetic field through the Faraday effect is a local effect in the fiber, it is the ratio of the Berry's phase to the linear birefringence per unit length which is effective in reducing the effect of linear birefringence on the sensitivity of the fiber to the magnetic field produced by an electrical current.

Figure 1:
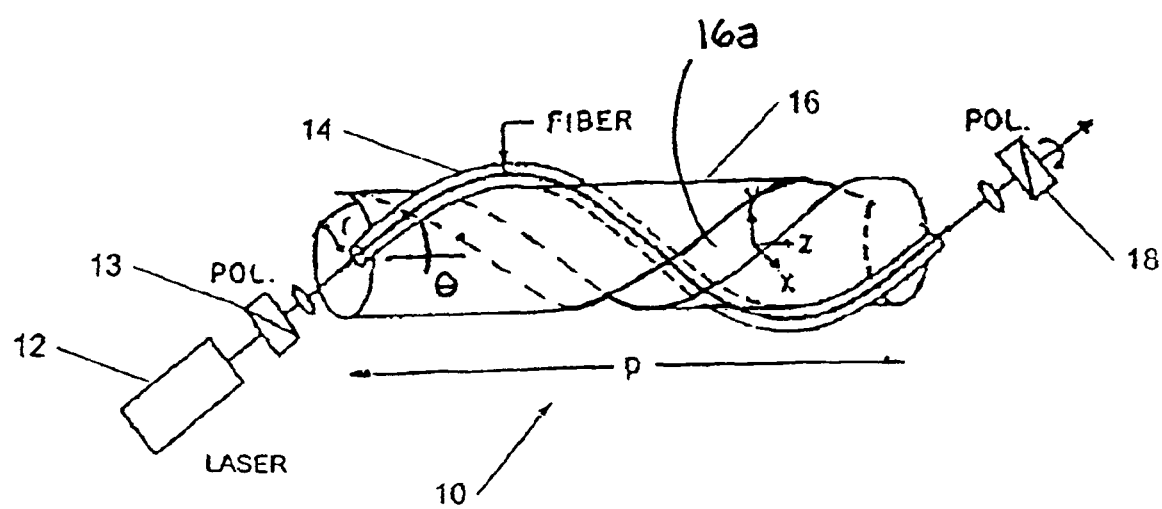
FIG. 1 shows a schematic perspective view of a fiber coil exhibiting a circular birefringence due to Berry's phase.

Referring now to FIG. 1, in one embodiment of the invention, a Berry's phase coil 10 may be obtained by winding a section of optical fiber 14 in the form of a helix, e.g., by winding the fiber around a cylinder 16 having a radius R. Optical radiation produced, for example, by a laser 12 is polarized by a polarizer 13 and coupled on the end of the fiber 14. The fiber 14 may be wound around the cylinder 16 without torsion, making one turn within a length p of the cylinder 16. The length p is referred to as the "pitch." Radiation exiting the fiber 14 passes through a polarizer 18, with a detector (not shown) detecting a change in the polarization direction.

It can be shown that the phase change per turn of a helical coil due to Berry's phase is:

$$\phi = 2\pi(1-\cos\Theta) = 2\pi(1-p/s) \qquad \text{Eq. (1)}$$

wherein:
  $\Theta$=helix angle with respect to the coil axis;
  s=length of one turn; and
  p=pitch.
The pitch is expressed as
  $p=2\pi R/\tan(\Theta)$, with
  R=coil radius.

We can see that p/s=0 for a pitch angle of 90°, giving a Berry's phase of $2\pi$/turn, which is indistinguishable from no rotation at all. For a pitch angle of 0°, p/s=1, and there is also no effective Berry's phase. The maximum observable Berry's phase is $\pi$, corresponding to a pitch angle of 60°. Unlike the conventional torsion-induced circular birefringence discussed above, the Berry topological phase change effect does not require torsional stress. The effect is therefore different from the effect of twisting the fiber.

For current measurements, a wire carrying a current to be measured may be surrounded by the helix 10 and extend approximately parallel to the axis of the helix. Providing that the magnetic field associated with the current is assumed to be constant along the length of the helix, the helix need not form a closed loop around current carrying conductor, although an integral number of turns may be preferred. Accordingly, bends in the conductor should be avoided. There is no reason to put the fiber in tension as the Berry's phase arises intrinsically due to the topology.

In an advantageous embodiment of a simple helix, the form, or cylinder 16 on which the helix of fiber 14 may be wound may be slotted, as illustrated by slot 16a of cylinder 16, so as to provide an open space between the fiber turns. In the manner of this embodiment, the form 16 itself may be in the shape of a helix, so that the helix of fiber 14 and form 16 may be threaded onto the conductor without breaking the conductor.

Figure 2:
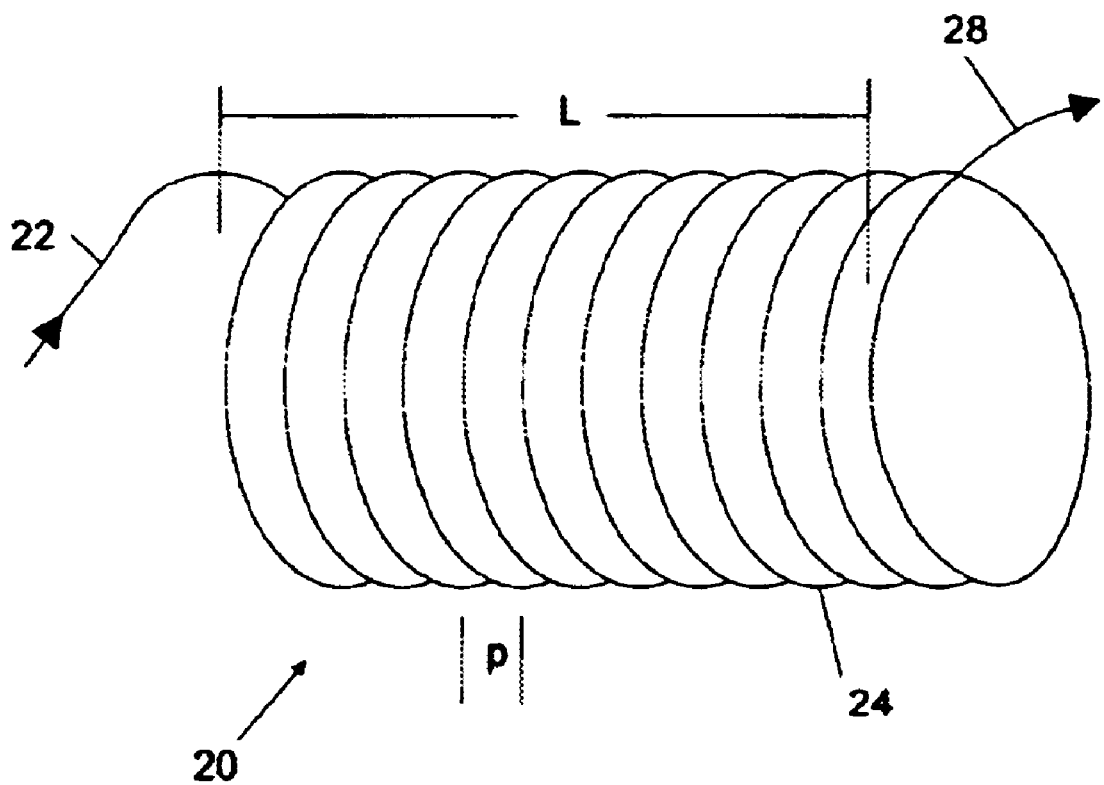
FIG. 2 is a multi-turn Berry's phase coil according to the invention.

Referring now to FIG. 2, an exemplary embodiment of a fiber coil 20 may have 12 turns of optical fiber 24 wrapped along a cylinder (not shown) having a length L of approximately 1 meter in a uniform helix of radius R≅0.5 cm. Based on calculations, the pitch p of each coil is 100 cm/12=8.33 cm, with a pitch angle of 21° and the length of a single turn is 8.9 cm. Accordingly, the Berry's phase per turn, in accordance with Equation (1), is $\phi=2\pi*(1-p/s)=0.40$ radians or 23°, corresponding to a total Berry's phase for the entire coil of approximately 280°. Optical radiation may be introduced into the fiber 24 at a first fiber end 22 and detected at a second fiber end 28, similar to the exemplary fiber helix described above with reference to FIG. 1. The resultant Berry's phase may be made significantly greater that the deleterious linear birefringence and may have the desired effect of "swamping" the linear birefringence in the same manner as would a comparable amount of circular birefringence. In an optimized configuration that produces the greatest Berry's phase change per turn, the sensor coil may have a pitch of approximately 60° instead of 21°, enhancing the effect by a factor of $\pi(0.40)=7.9$.

Unlike the fiber coils described in the prior art, the coil of the invention may be wound without torsion. This is easily accomplished by either properly rotating the fiber payout spool (one revolution for each winding of the helix), by enclosing the fiber in a loose Teflon tube before winding, and the like. Since no torsion is introduced into the fiber, the number of turns in a coil may be much greater using Berry's phase without concern for creep or stress induced failures. Thus, the possible effect introduced by the Berry's phase may be greater, due to the increased number of turns possible, than if the coil winding method introduced torsional stress or tension into the fiber. The number of turns may be increased, for example, by reversing the helix direction, i.e., by going back and forth in two directions, as will be described in conjunction with FIG. 4.

Figure 3:
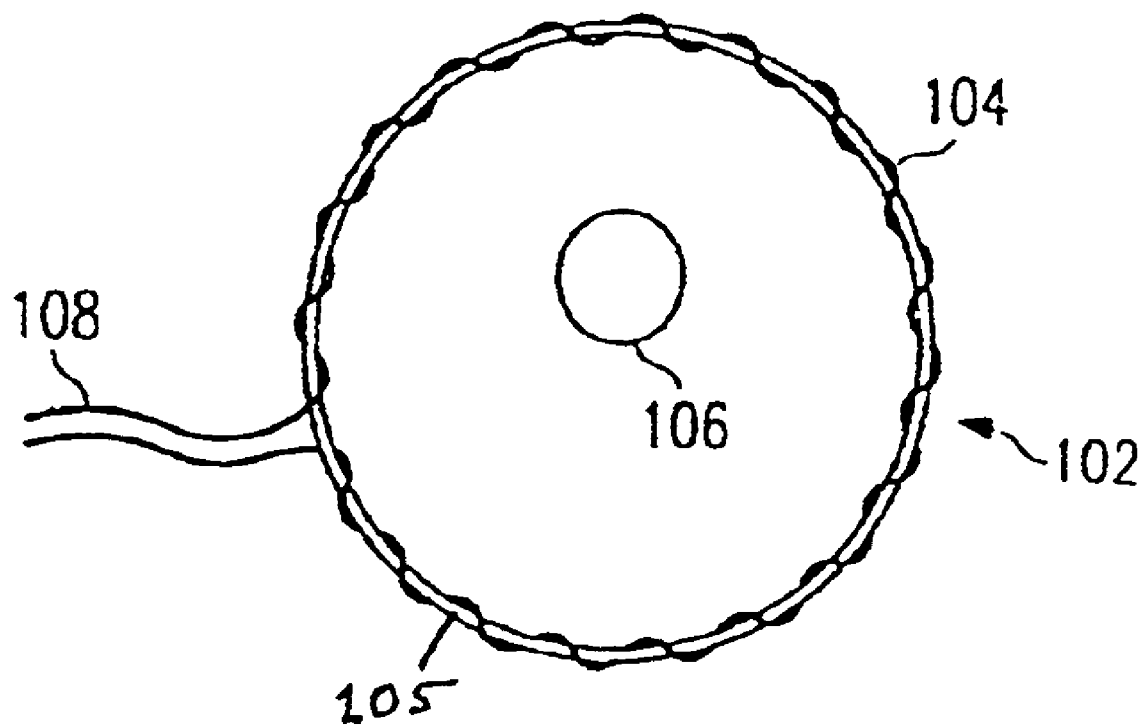
FIG. 3 is an alternative embodiment of a Berry's phase coil according to the invention.

In accordance with an embodiment of the present invention, the fiber may be wound in several configurations. As illustrated in FIG. 3, the coil 102 may be formed by winding a fiber 108 in the form of a helix 104 around a torus 105 encircling the conductor 106, shown in cross-section. As in the embodiments of FIGS. 1 and 2, the fiber may be wound without twisting, i.e., without introducing torsional stress or tension into the fiber. This embodiment corresponds to the theoretical process of performing the line integral of the magnetic field, and is an effective way of accurately estimating the current.

Figure 4:
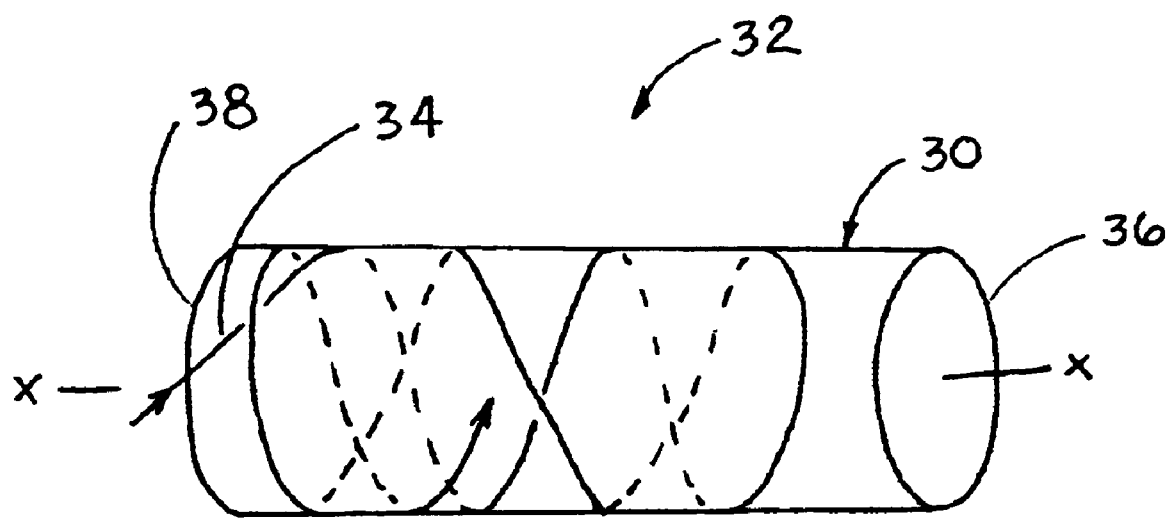
FIG. 4 is yet another embodiment of a Berry's phase coil according to the invention.

In yet another embodiment illustrated in FIG. 4, a helix may also be wound around a cylinder 30 as a bobbin 32. In this embodiment, the winding direction of fiber 34 (along the axis of symmetry x—x) may be reversed as the fiber 34 nears the end 36 of cylinder 30. The winding may then proceed in a direction towards end 38 of cylinder 30 and may reverse back towards end 36 as the fiber 34 nears end 38. In the illustration of FIG. 4, two reversals are shown, but it will be understood that winding of fiber 34 in this bobbin fashion may have one or more reversals. When reversing direction at the end 36, or end 38, the pitch of the fiber 34 typically decreases to zero at some point. Since a 90° pitch does not produce a Berry's phase, the length of fiber in the reversal regions near ends 36 and 38 should be minimized. Any of these sensing coils may be configured as either a Sagnac interferometer (although using the Faraday effect to achieve the phase shift) or a reflective coil, by introducing a reflector at the end of the fiber most distant from the optical source. Winding of the helical coil in this bobbin fashion is advantageous where the axial length of the coil is much shorter than would be necessary to accommodate the number of turns. Since the sense of rotation is unchanged, the Faraday effect is still cumulative. If the coil starts and ends at the same point along the length of the conductor, i.e., an odd number of reversals, this establishes a closed integral path, with the sensing coil enclosing the current and minimizing sensitivity to non-uniform magnetic fields. Whether a cumulative Berry's phase exists is not relevant, since it is the Berry's phase per unit length, compared to the linear birefringence per unit length that is the determining performance factor.

In addition to decreasing the effects of linear birefringence by using Berry's phase, lengths of the fiber may be separated by controlled twists located between the fiber sections, as disclosed in U.S. Provisional Patent Application No. 60/222,389 "Reduction of Linear Birefringence in Circular-Cored Single-Mode Fiber" to R. Dyott and S. Bennett, filed Aug. 2, 2000, and incorporated herein by reference.

The design considerations disclosed herein may be applied to helixes of varying diameters, and toroidal forms of varying diameters may be used as well to suit the particular installation. The coils made with this invention may be used in both open and closed loop signal processing configurations, and in both interferometric and polarimetric optical configurations.

Figure 5:
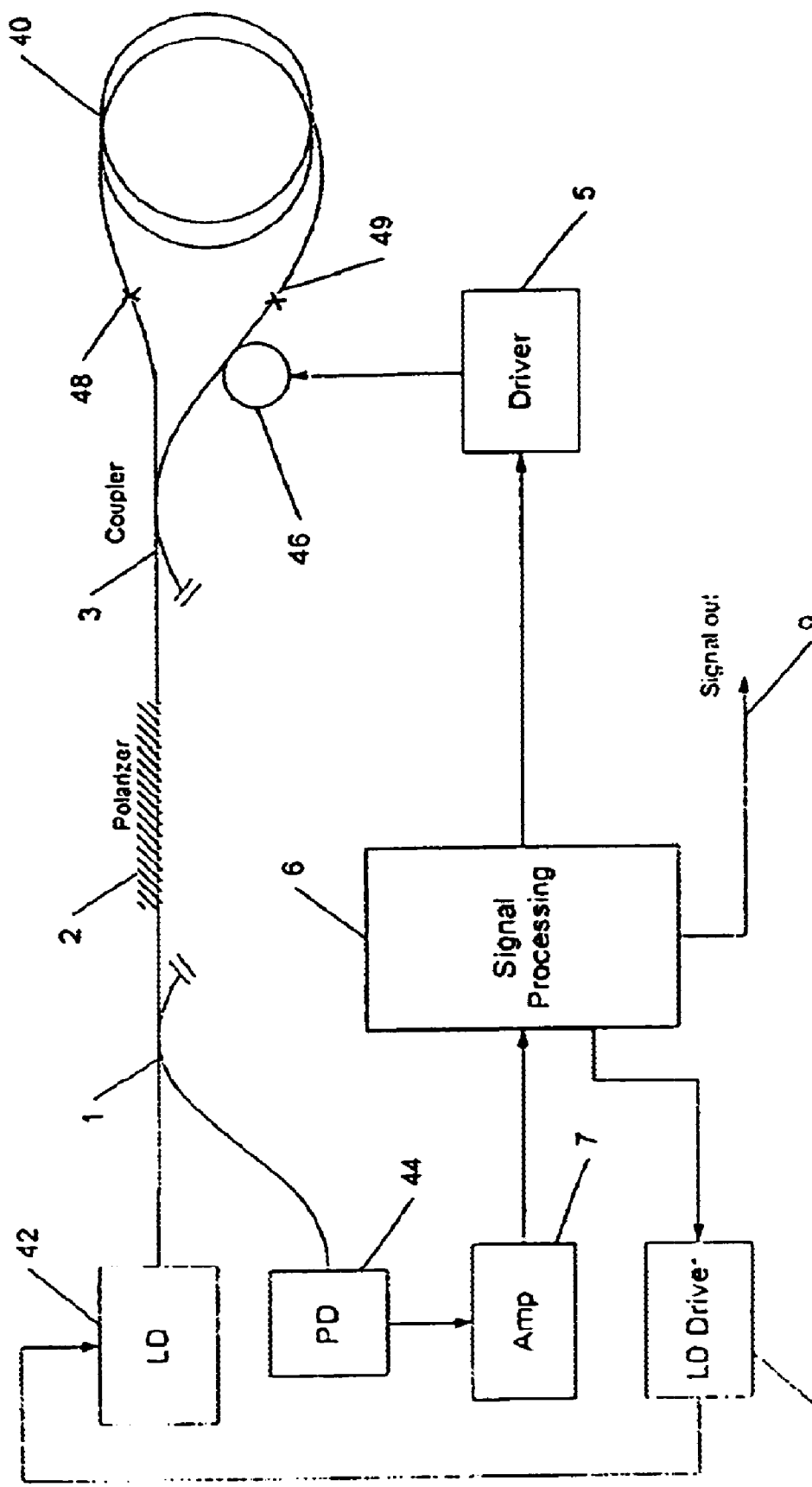
FIG. 5 is a fiber-optic current sensor embodying the Berry's phase coil according to the invention.

One embodiment of the Berry's phase coil may be employed with fiber-optic current sensors, for example, having the design illustrated in FIG. 5. Light emitted from a suitable light source 42 may pass through a first 3 dB coupler 1 where half of the light may be dissipated, and half may be sent through the polarizer 2. A second 3 dB coupler 3 may split the light into two approximately equal intensity, counter-propagating beams which may traverse the coil 40, which in the embodiment of FIG. 5, according to the invention, may be a Berry's phase coil. The two light beams exiting the coil 40 may then recombine at the second coupler 3 where they interfere. This combined light beam may then pass through the polarizer 2 a second time in the opposite direction, and half of the light may be directed to the photodetector 44 by the first coupler 1. An optical splitting ratio of 3 dB is typically selected for the couplers to maximize the optical power incident on the detector. Two $\lambda/4$ waveplates 48, 49 may be placed near the sensor coil ends. Those skilled in the art will understand that the $\lambda/4$ waveplates are located at the end of polarization-maintaining fiber leads from the coupler 3 which may have a considerable length.

A piezo-electric transducer (PZT) 46 may be used to modulate the phase difference between the two counter-propagating light beams. Other methods of modulating the phase difference, for example, using an electro-optic material such as lithium niobate and/or non-linear polymers, may also be employed. This phase modulation serves two purposes. One is to dynamically bias the interferometer to a more sensitive operating point and also allow the determination of rotation sense. The other is to move the detected signal from direct current (DC) to alternating current (AC) in order to improve the accuracy of the electrical signal processing. With sinusoidal phase modulation, the interferometer output signal is an infinite series of sinusiodal waveforms whose frequencies are integral multiples of the modulation frequencies and whose maximum amplitudes are Bessel functions related to the phase modulation amplitude. The ratio of the amplitudes of the fundamental and the next three lowest order harmonic signals can be used to detect rotation rate and/or magnetic field, while at the same time maintaining a stable, linear output scale factor. The light source intensity and modulator amplitude may be controlled via drivers 5, 8 by analog and/or digital electronic hardware 6 which receives input signals from detector 44 via amplifier 7.

While the invention has been disclosed in connection with the preferred embodiments shown and described in detail, various modifications and improvements thereon will become readily apparent to those skilled in the art. For example, the aforedescribed Berry's phase coil may also be used with fiber optic current sensors, such as the minimum configuration (MC) and reduced minimum configuration (RMC) current sensor described in the copending U.S.

patent application Ser. No. 09/459,438, which is incorporated herein by reference. Accordingly, the spirit and scope of the present invention is to be limited only by the following claims.

What is claimed is:

1. A fiber optic coil comprising an optical fiber, wherein the optical fiber is wound about a central axis in alternating, opposing winding directions, having at least one winding, the winding having a pitch angle selected to result in a phase shift of circularly polarized light propagating through the fiber, said phase shift caused by Berry's phase, with a length of the fiber in a region where the winding direction changes being substantially smaller than the length of the fiber in either of the opposing winding directions.

2. The coil according to claim 1, wherein the central axis is generally in the shape of a circle.

3. The coil according to claim 2, wherein the circle surrounds a current carrying conductor.

4. The coil according to claim 3, wherein the pitch angle is between 0° and 90°.

5. The coil according to claim 4, wherein the pitch angle is substantially equal to 60°.

6. The fiber optic coil of claim 1, wherein a current carrying conductor is placed generally along the central axis of the coil.

7. The coil according to claim 6, wherein the pitch angle is between 0° and 90°.

8. The coil according to claim 7, wherein the pitch angle is substantially equal to 60°.

9. The coil according to claim 6, wherein the coil is wound about a cylindrical form, the coil being disposed adjacent the cylindrical form.

10. The coil according to claim 9, wherein the form is slotted to allow placement of the conductor along the central axis.

11. The coil according to claim 6, further comprising two counter-propagating light beams that traverse the coil.

12. The coil according to claim 11, further comprising:
 (a) a quarter wave plate connected at each respective end of the coil; and
 (b) a coupler connected to each quarter wave plate, the coupler receiving light from a source and splitting the light to form the two counter-propagating light beams.

13. The coil according to claim 12, further comprising a phase modulator connected between one of the quarter wave plates and the coupler.

14. The coil of claim 13, wherein the phase modulator is a piezo-electric transducer.

15. The coil of claim 13, wherein the phase modulator is an electro-optic material.

16. A fiber optic coil, comprising an optical fiber wound without torsion in a helical manner about a central axis in alternating, opposing winding directions to form the coil, each winding having a pitch angle selected to result in a phase shift of circularly polarized light propagating through the fiber, said phase shift caused by Berry's phase resulting in reducing effects of linear birefringence in the coil, a length of the fiber in a region where the winding direction changes being substantially smaller than the length of the fiber in either of the opposing winding directions.

17. The coil of claim 16, wherein the pitch angle of each winding direction is substantially the same.

18. The coil according to claim 17, wherein a current carrying conductor is placed generally along the central axis of the coil, the coil serving as a current sensor with stabilized sensitivity resulting from the reduced effects of linear birefringence.

19. The coil according to claim 18, wherein the pitch angle is between 0° and 90°.

20. The coil according to claim 19, wherein the pitch angle is substantially equal to 60°.

21. The coil according to claim 16, further comprising a reflector attached to an end of the coil.

* * * * *